United States Patent
Salama et al.

(10) Patent No.: US 10,340,007 B2
(45) Date of Patent: Jul. 2, 2019

(54) RESISTIVE CONTENT ADDRESSABLE MEMORY BASED IN-MEMORY COMPUTATION ARCHITECTURE

(71) Applicants: KING ABDULLAH UNIVERSITY OF SCIENCE AND TECHNOLOGY, Thuwal (SA); THE REGENTS OF THE UNIVERSITY OF CALIFORNIA, Oakland, CA (US)

(72) Inventors: Khaled Nabil Salama, Thuwal (SA); Mohammed Affan Zidan, Thuwal (SA); Fadi J. Kurdahi, Oakland, CA (US); Ahmed Eltawil, Oakland, CA (US); Hasan Erdem Yantir, Santa Ana, CA (US)

(73) Assignees: KING ABDULLAH UNIVERSITY OF SCIENCE AND TECHNOLOGY, Thuwal (SA); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/572,852

(22) PCT Filed: Jun. 3, 2016

(86) PCT No.: PCT/IB2016/053282
§ 371 (c)(1),
(2) Date: Nov. 9, 2017

(87) PCT Pub. No.: WO2016/193947
PCT Pub. Date: Dec. 8, 2016

(65) Prior Publication Data
US 2018/0137916 A1  May 17, 2018

Related U.S. Application Data

(60) Provisional application No. 62/171,580, filed on Jun. 5, 2015.

(51) Int. Cl.
*G11C 15/04* (2006.01)
*G11C 13/00* (2006.01)

(52) U.S. Cl.
CPC ........ *G11C 15/046* (2013.01); *G11C 13/0002* (2013.01); *G11C 13/0007* (2013.01); *G11C 13/0023* (2013.01)

(58) Field of Classification Search
None
See application file for complete search history.

(56) References Cited

U.S. PATENT DOCUMENTS

| | | | |
|---|---|---|---|
| 2013/0054886 A1* | 2/2013 | Eshraghian | G11C 13/0007 711/108 |
| 2013/0218815 A1* | 8/2013 | Nugent | G06N 5/025 706/12 |

(Continued)

OTHER PUBLICATIONS

Hasan, R., et al., "Memristor Crossbar Based Programmable Interconnects", 2014 IEEE Computer Society Annual Symposium on VLSI, IEEE, Jul. 9, 2014, pp. 94-99.

(Continued)

*Primary Examiner* — Douglas King
(74) *Attorney, Agent, or Firm* — Patent Portfolio Builders PLLC

(57) ABSTRACT

Various examples are provided examples related to resistive content addressable memory (RCAM) based in-memory computation architectures. In one example, a system includes a content addressable memory (CAM) including an array of cells having a memristor based crossbar and an interconnection switch matrix having a gateless memristor array, which is coupled to an output of the CAM. In another example, a method, includes comparing activated bit values stored a key register with corresponding bit values in a row of a CAM, setting a tag bit value to indicate that the activated bit values match the corresponding bit values, and (Continued)

writing masked key bit values to corresponding bit locations in the row of the CAM based on the tag bit value.

19 Claims, 13 Drawing Sheets

(56) References Cited

U.S. PATENT DOCUMENTS

| | | | | |
|---|---|---|---|---|
| 2015/0070957 | A1* | 3/2015 | Otsuka | G11C 8/12 365/49.17 |
| 2015/0170025 | A1* | 6/2015 | Wu | G06N 3/0445 706/25 |
| 2015/0347896 | A1* | 12/2015 | Roy | G11C 11/16 365/148 |

OTHER PUBLICATIONS

International Search Report in related International Application No. PCT/IB2016/053282, dated Aug. 26, 2016.
Sharad, M. et al., "Ultra-Low Energy, High-Performance Dynamic Resistive Threshold Logic", Aug. 8, 2013, pp. 1-3.
Written Opinion of the International Searching Authority in related International Application No. PCT/IB2016/053282, dated Aug. 26, 2016.
Yavits, L., et al., "Computer Architecture with Associative Processor Replacing Last-Level Cache and SIMD Accelerator", IEEE Transactions on Computers, IEEE Service Center, Los Alamitos, CA, US, Jan. 16, 2015, vol. 54, No. 2, pp. 368-381.
Yavits, L., et al., "Resistive Associative Processor", IEEE Computer Architecture Letters, Nov. 24, 2014, pp. 1-4 & Yavits, L., et al., "Resistive Associative Processor", IEEE Computer Architecture Letters, Jan. 1, 2016, vol. 14, No. 2, pp. 148-151.
Zidan, M.A., "Memristor Circuits and Systmes", Thesis, May 31, 2015, pp. 1-163, King Abdullah University of Science and Technology, Kingdom of Saudi Arabia.
Zidan, M.A., et al., "Memristor Multipart Readout: A Closed-Form Solution for Sneak Paths", IEEE Transactions on Nanotechnology, Mar. 2014, vol. 13, No. 2, pp. 274-282.
"International Technology Roadmap for Semiconductors—ITRS 2.0 Home Page" downloaded from the internet Apr. 10, 2018, [Online]. Available: http://www.itrs2.net.
Arizona State University, "Predictive Technology Model (PTM)", downloaded from the internet Apr. 10, 2018, [Online]. Available: http://ptm.asu.edu/.
Borkar, S., "Exascale Computing—A Fact or Fiction?," Webinar, 2013 IEEE 27th International Symposium on Parallel & Distributed Processing, Solid-State Circuits Conference, Jun. 2013.
Carmona-Galan, R., et al., "Parallel Processing Architectures and Power Efficiency in Smart Camera Chips" Workshop on the Architecture of Smart Cameras, Pisa, Italy, 2014.
Chiu, P.-F., et al., "Low Store Energy, Low VDDmin, 8T2R Nonvolatile Latch and SRAM with Vertical—Stacked Resistive Memory (Memristor) Devices for Low Power Mobile Applications," IEEE Journal of Solid-State Circuits, Jun. 2012, vol. 47, No. 6, pp. 1483-1496.
Do, A.T., "0.77 fJ/bit/search Content Addressable Memory Using Small Match Line Swing and Automated Background Checking Scheme for Variation Tolerance," IEEE Journal of Solid-State Circuits, Jul. 2014, vol. 49, No. 7, pp. 1487-1498.
Eshraghian, K., et al., "Memristor MOS Content Addressable Memory (MCAM): Hybrid Architecture for Future High Performance Search Engines," IEEE Transactions on Very Large Scale Integration (VLSI) Systems, Aug. 2011, vol. 19, No. 8, pp. 1407-1417.
Foster, C.C., "Content Addressable Parallel Processors," New York, NY, USA: John Wiley & Sons, Inc., 1976, Book Reviews, Proceedings of the IEEE, Aug. 1978, vol. 66, No. 8, pp. 988-989.
Guo, Q. et al., "AC-DIMM: Associative Computing with STT-MRAM," Proceedings of the 40th Annual International Symposium on Computer Architecture, Jun. 2013, pp. 189-200.
Jarollahi, H., et al., "Architecture and Implementation of an Associative Memory Using Sparse Clustered Networks," 2012 IEEE International Symposium on Circuits and Systems (ISCAS), May 2012, pp. 2901-2904.
Junsangsri, P., et al., "A Memristor-Based Team (Ternary Content Addressable Memory) Cell," 2014 IEEE/ACM International Symposium on Nanoscale Architectures (NANOARCH), Jul. 2014, pp. 1-6.
Kornblum, J., "NIST Basic Memory Images," downloaded from the Internet Apr. 10, 2018, [Online]. Available: http://www.cfreds.nist.gov/mem/Basic_Memory_Images.html.
Li, J. et al., "1 Mb 0.41 um2 2T-2R Cell Nonvolatile TCAM With Two-Bit Encoding and Clocked Self-Referenced Sensing," IEEE Journal of Solid-State Circuits, Apr. 2014, vol. 49, No. 4, pp. 896-907.
Pagiamtzis, K., et al., "Content-Addressable Memory (CAM) Circuits and Architectures: A Tutorial and Survey," IEEE Journal of Solid-State Circuits, Mar. 2006, vol. 41, No. 3, pp. 712-727.
Scherson, I.D., et al., "A Reconfigurable Fully Parallel Associative Processor," Journal of Parallel and Distributed Computing, Feb. 1989, vol. 6, N. 1, pp. 69-89.
Tabassum, S., et al., "Low Power High Speed Ternary Content Addressable Memory Design Using MOSFETs and Memristors," 2014 International Conference on Electronics and Communication Systems (ICECS), Feb. 2014, pp. 1-6.
Vontobel, P.O., et al., "Writing to and Reading From a Nano-Scale Crossbar Memory Based on Memristors," Nanotechnology, 2009, vol. 20, No. 42, p. 425204-425225.
Yang, B.-O., et al., "A Low Power Content Addressable Memory Using Low Swing Search Lines," IEEE Transactions on Circuits and Systems—I: Regular Papers, Dec. 2011, vol. 58, No. 12, pp. 2849-2858.
Zheng, L., et al., "Memristors-Based Ternary Content Addressable Memory (mTCAM)," 2014 IEEE International Symposium on Circuits and Systems (ISCAS), Jun. 2014, pp. 2253-2256.
Zidan, M.A. et al., "Compensated Readout for High-Density MOS-Gated Memristor Crossbar Array," IEEE Transactions on Nanotechnology, Jan. 2015, vol. 14, No. 1, pp. 3-6.
Zidan, M.A. et al., "Memristor-Based Memory: The Sneak Paths Problem and Solutions," Microelectronics Journal, Feb. 2013, vol. 44, No. 2, pp. 176-183.
First Examination Report in corresponding/related GCC Application No. GC 2016-31432, dated Mar. 21, 2019 (Documents D1 and D2 were cited in the IDS filed Nov. 9, 2017).

* cited by examiner

|    |   |   | In-place |   |          | Out-of-place |   |          |
| -- | - | - | -------- | - | -------- | ------------ | - | -------- |
| Cr | B | A | Cr       | B | Comment  | Cr           | R | Comment  |
| 0  | 0 | 0 | 0        | 0 | NC       | 0            | 0 | NC       |
| 0  | 0 | 1 | 0        | 1 | 2nd Pass | 0            | 1 | 1st Pass |
| 0  | 1 | 0 | 0        | 1 | NC       | 0            | 1 | 2nd Pass |
| 0  | 1 | 1 | 1        | 0 | 1st Pass | 1            | 0 | 5th Pass |
| 1  | 0 | 0 | 0        | 1 | 3rd Pass | 0            | 1 | 3rd Pass |
| 1  | 0 | 1 | 1        | 0 | NC       | 1            | 0 | NC       |
| 1  | 1 | 0 | 1        | 0 | 4th Pass | 1            | 0 | NC       |
| 1  | 1 | 1 | 1        | 1 | NC       | 1            | 1 | 4th Pass |

FIG. 2A

|    |   |   | In-place |   |          | Out-of-place |   |          |
| -- | - | - | -------- | - | -------- | ------------ | - | -------- |
| Br | B | A | Br       | B | Comment  | Br           | R | Comment  |
| 0  | 0 | 0 | 0        | 0 | NC       | 0            | 0 | NC       |
| 0  | 0 | 1 | 1        | 1 | 1st Pass | 1            | 1 | 1st Pass |
| 0  | 1 | 0 | 0        | 1 | NC       | 0            | 1 | 2nd Pass |
| 0  | 1 | 1 | 0        | 0 | 2nd Pass | 0            | 0 | NC       |
| 1  | 0 | 0 | 1        | 1 | 4th Pass | 1            | 1 | 3rd Pass |
| 1  | 0 | 1 | 1        | 0 | NC       | 1            | 0 | NC       |
| 1  | 1 | 0 | 0        | 0 | 3rd Pass | 0            | 0 | 4th Pass |
| 1  | 1 | 1 | 1        | 1 | NC       | 1            | 1 | 5th Pass |

FIG. 2B

$c$: location of active carry
$a$: location of $A$'s active bit
$b$: location of $B$'s active bit
$r$: location of Result's active bit procedure ADDITIONCONTROL($A, B, Cr$)
    for all $a$ *in* $A$ and $b$ *in* $B$ do
        Apply Table of FIG. 2A to $a, b, r, Cr$
        $r \leftarrow r + 1$
    end for
end procedure procedure MULTIPLICATIONCONTROL($A, B$)
    for all $a$ *in* $A$ do
        $Cr \leftarrow r + B's\ size$
        for all $b$ *in* $B$ do
            Apply Table of FIG. 4C to $a, b, r, Cr$
            $r \leftarrow r + 1$
        end for
        $r \leftarrow r - B's\ size + 1$
    end for
end procedure

FIG. 3

| $F$ | $A$ | $F'$ | $R$ | Comment |
|---|---|---|---|---|
| 0 | 0 | 0 | 0 | NC |
| 0 | 1 | 1 | 1 | 3th Pass |
| 1 | 0 | 1 | 1 | 1st Pass |
| 1 | 1 | 1 | 0 | 2nd Pass |

FIG. 4A

| $F$ | $S$ | $A$ | $F'$ | $R$ | Comment |
|---|---|---|---|---|---|
| 0 | 0 | 0 | 0 | 0 | NC |
| 0 | 0 | 1 | 0 | 1 | 1st Pass |
| 0 | 1 | 0 | 0 | 0 | NC |
| 0 | 1 | 1 | 1 | 1 | 4th Pass |
| 1 | 0 | 0 | 0 | 1 | NP |
| 1 | 0 | 1 | 1 | 0 | NP |
| 1 | 1 | 0 | 1 | 1 | 2nd Pass |
| 1 | 1 | 1 | 1 | 0 | 3rd Pass |

FIG. 4B

FIG. 5A  Sign extension

FIG. 5B  Sign conversion

| Function | RunTime | Area/Row | Complexity |
|---|---|---|---|
| Addition (in-place) | $4m$ | $2m+1$ | $O(m)$ |
| Addition (out-of-place) | $5m$ | $3m+1$ | $O(m)$ |
| Subtraction (in-place) | $4m$ | $2m+1$ | $O(m)$ |
| Subtraction (out-of-place) | $5m$ | $3m+1$ | $O(m)$ |
| 2's Complement | $3m$ | $2m+1$ | $O(m)$ |
| Absolute Value | $4m$ | $2m+1$ | $O(m)$ |
| Multiplication (unsigned) | $4m^2$ | $4m$ | $O(m^2)$ |
| MAC (unsigned) | $4m^2$ | $4m$ | $O(m^2)$ |
| Multiplication (sign extension) | $16m^2 + 4m$ | $8m$ | $O(m^2)$ |
| Multiplication (sign conversion) | $4m^2 + 16m + 1$ | $8m+4$ | $O(m^2)$ |

FIG. 6

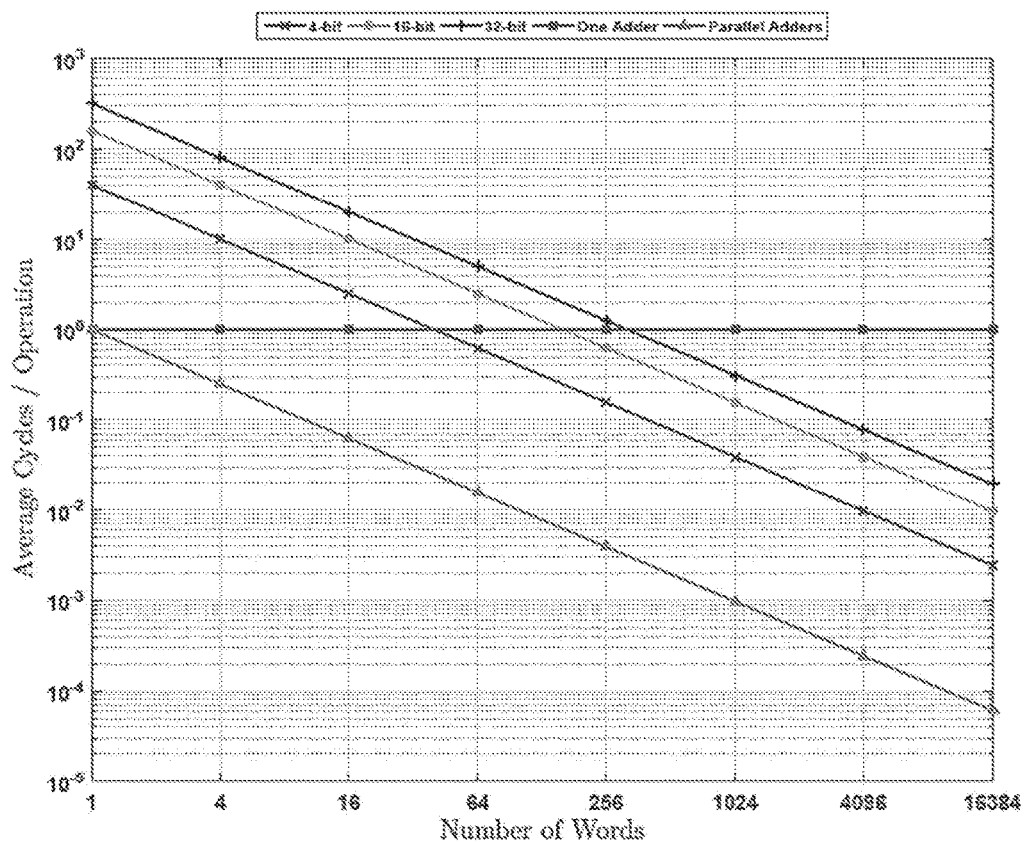

FIG. 7A

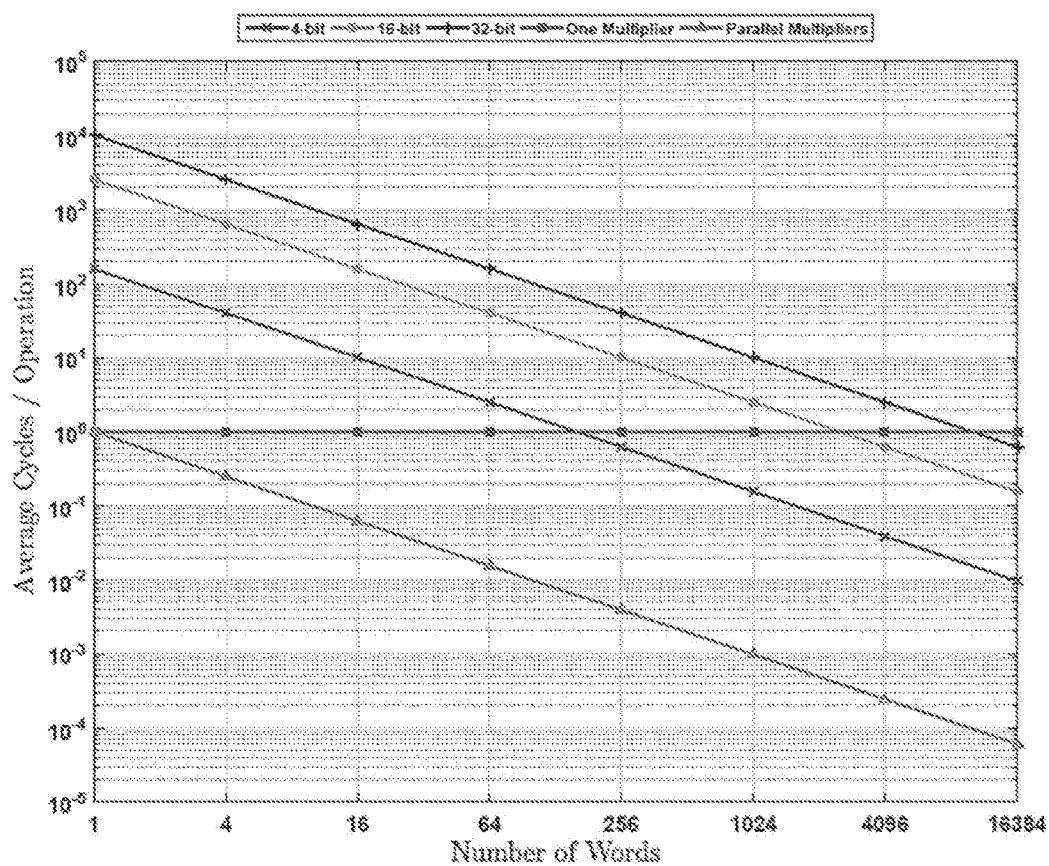
FIG. 7B
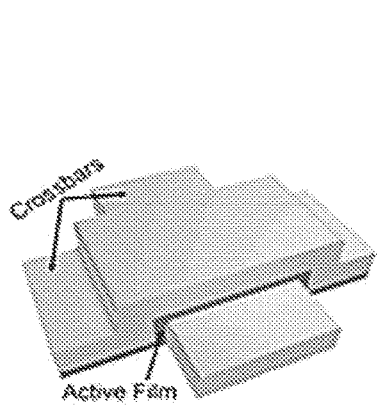
(a)
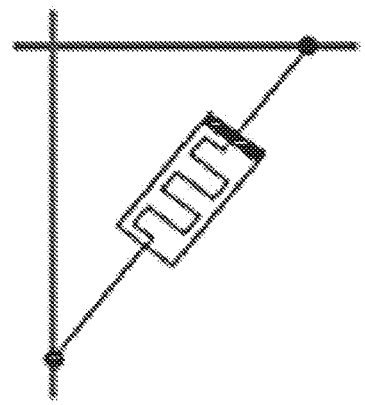
(b)
FIG. 8A

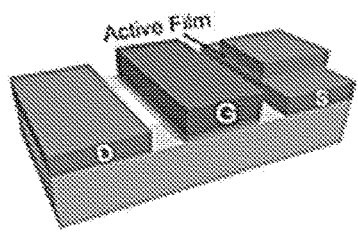
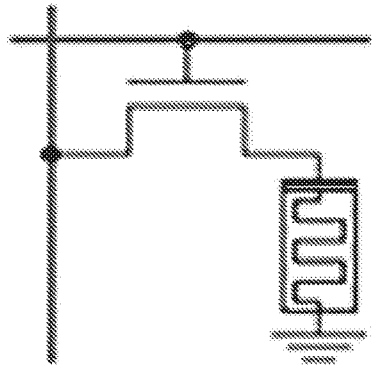
(a)      FIG. 8B      (b)
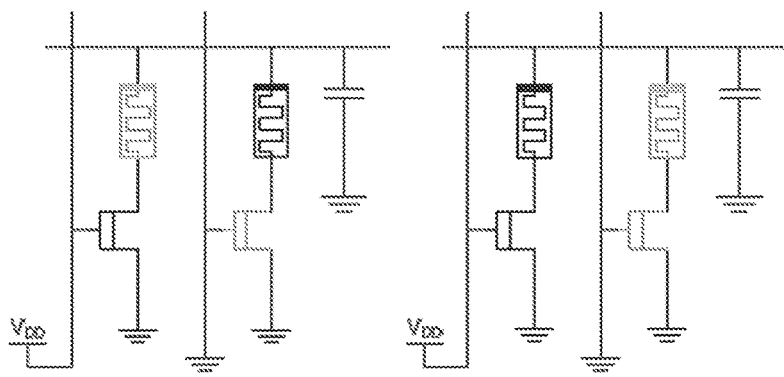
(a) Evaluation Phase     (b) Mismatch     FIG. 9B
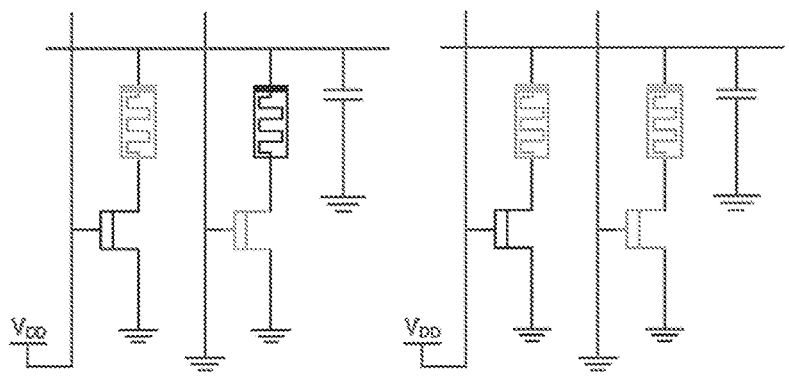
(c) Evaluation Match     (d) Dont Care

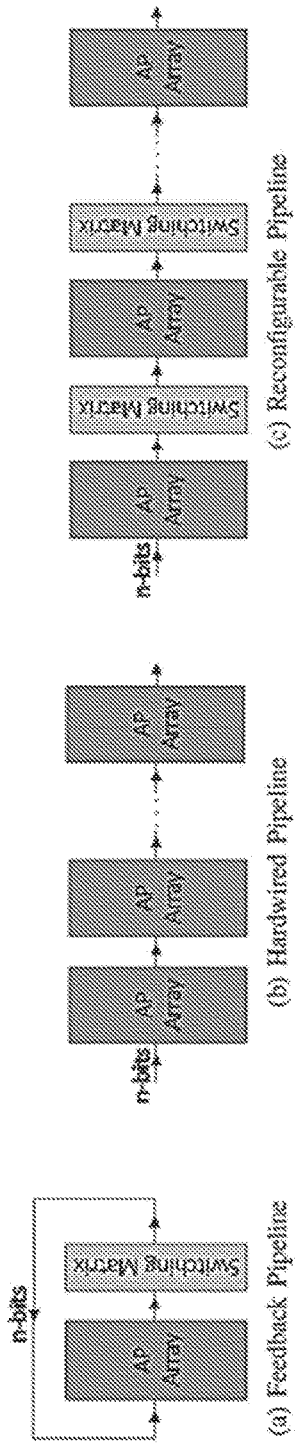
FIG. 9A
FIG. 10
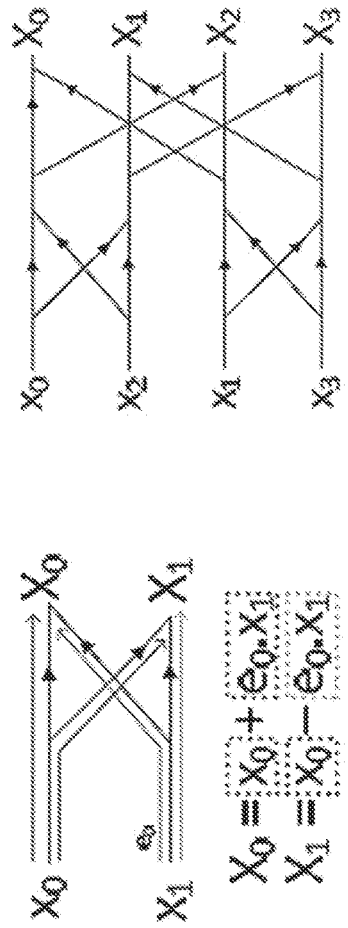
FIG. 11A
FIG. 11B

Butterfly on a row procedure BUTTERFLY($a, b$)
    $|b| \leftarrow Abs(b, s(b))$
    $|e|x|b| \leftarrow Multiply(|e|, |b|)$
    $t1 \leftarrow XOR(s(e), s(b))$
    $exb \leftarrow Abs(|e|x|b|, t1)$
    $b \leftarrow SubtractOOP(exb, a)$
    $a \leftarrow AddIP(exb, a)$
end procedure Butterfly algorithm for RAP

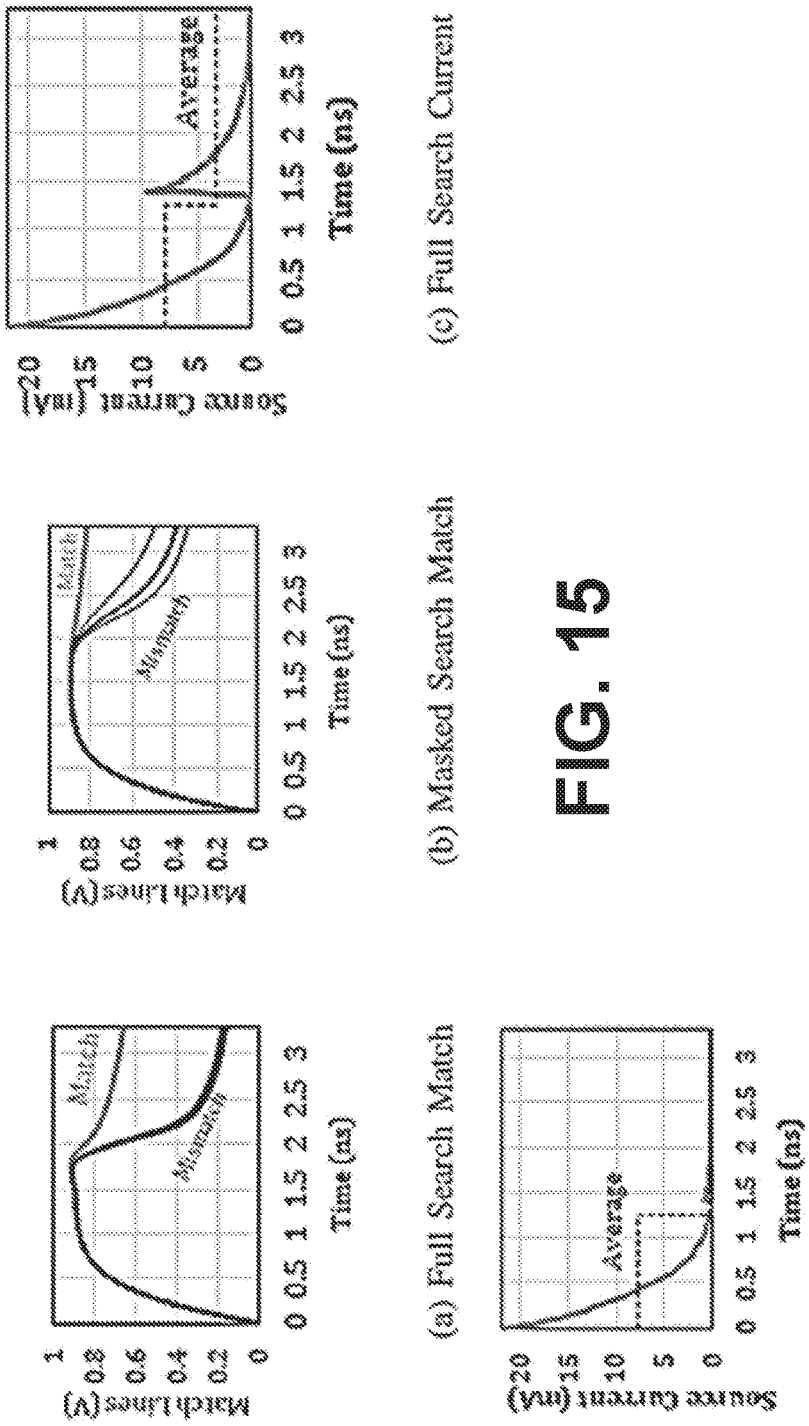

US 10,340,007 B2

RESISTIVE CONTENT ADDRESSABLE MEMORY BASED IN-MEMORY COMPUTATION ARCHITECTURE

CROSS REFERENCE TO RELATED APPLICATIONS

This application is a National Stage of International Application No. PCT/IB2016/053282, filed Jun. 3, 2016, which claims priority to, and the benefit of, co-pending U.S. provisional application entitled "RESISTIVE CONTENT ADDRESSABLE MEMORY BASED IN-MEMORY COMPUTATION ARCHITECTURE" having Ser. No. 62/171,580, filed Jun. 5, 2015, which is hereby incorporated by reference in its entirety.

BACKGROUND

One means of increasing the performance of computing systems is by increasing parallelism rather than depending on transistor feature reduction per Moore's Law. But, this approach becomes limited if processing elements cannot consume data from memory at the desired processing rate, leading to a significantly degraded overall performance.

SUMMARY

Embodiments of the present disclosure are related to resistive content addressable memory (RCAM) based in-memory computation architectures.

In one embodiment, among others, a system comprises a content addressable memory (CAM) including an array of cells, where individual cells of the array of cells comprise a memristor based crossbar; and an interconnection switch matrix coupled to an output of the CAM, the interconnection switch matrix comprising a gateless memristor array. In another embodiment, a method comprises comparing activated bit values stored a key register with corresponding bit values stored in a row of the CAM, the comparison based upon a mask value indicating which bit values of the key value are the activated bit values; setting a tag bit value to indicate that the activated bit values match the corresponding bit values in the row of the CAM in response to the comparison; and writing masked key bit values to corresponding bit locations in the row of the CAM in response to the tag bit value.

In one or more aspects of these embodiments, a key register can store a key value and a mask register can indicate which bit or bits of the key value is activated for comparison or writing with a corresponding bit or bits of a data value stored in a row of the CAM. A tag field can comprise tag bits that are each associated with one row of the CAM, the tag bits indicating whether the bit or bits of the key value that are activated matches the corresponding bit or bits of the data value stored in that one row of the CAM. A controller can generate the key value and a mask value for the mask register in response to a next instruction to be performed on the data value in the CAM. The key value and the mask value can be based upon values in a look up table. An instruction cache can comprise a series of instructions to be performed on one or more data value in the CAM.

In one or more aspects of these embodiments, rows in the CAM can communicate in parallel via the interconnection switch matrix. The communications can be bitwise or wordwise. The interconnection switch matrix can direct the communications to rows of a second CAM or to different rows of the CAM. The interconnection switch matrix can be reconfigurable. A second CAM can be coupled to an output of the interconnection switch matrix and a second interconnection switch matrix can be coupled to the second CAM. A series of CAMs can implement successive stages of a Fast Fourier transform (FFT), where data exchange between the series of CAMs is provided by interconnection switch matrices. The memristor based crossbar can be a gated memristor crossbar. The memristor based crossbar can comprise a plurality of transistors and memristors.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 2A and 2B are examples of look-up tables for addition and subtraction, respectively, in accordance with various embodiments of the present disclosure.

FIG. 3 is an example of an algorithm for addition and multiplication control in accordance with various embodiments of the present disclosure.

FIGS. 4A, 4B, and 4C are examples of look-up tables for 2's complement, absolute value, and unsigned multiplication, respectively, in accordance with various embodiments of the present disclosure.

FIGS. 5A and 5B are examples of signed multiplication in accordance with various embodiments of the present disclosure.

FIG. 6 is a table illustrating examples of running time and area evaluation in accordance with various embodiments of the present disclosure.

FIGS. 7A and 7B are plots comparing addition and multiplication, respectively, of an AP with other architectures in accordance with various embodiments of the present disclosure.

FIGS. 8A and 8B include (a) perspective views and (b) schematic diagrams of examples of gateless and gated memristor cells, respectively, in accordance with various embodiments of the present disclosure.

FIG. 9A is a table illustrating examples of various CAM cell candidates of an AP in accordance with various embodiments of the present disclosure.

FIG. 9B includes schematic diagrams illustrating different states of a "2T2M" cell of a CAM array in accordance with various embodiments of the present disclosure.

FIG. 10 includes graphical representations of examples of pipelines in accordance with various embodiments of the present disclosure.

FIGS. 11A through 11C include schematic diagrams illustrating examples of Fast Fourier transform (FFT) operations in accordance with various embodiments of the present disclosure.

FIG. 11D is an algorithm illustrating FFT operations of the schematic diagram of FIG. 11C in accordance with various embodiments of the present disclosure.

FIGS. 14 and 15 include RCAM simulation results obtained during testing of RCAM simulation in accordance with various embodiments of the present disclosure.

FIG. 16 is a table illustrating the power and energy consumption of the simulated CAM array in accordance with various embodiments of the present disclosure.

DETAILED DESCRIPTION

Figure 1:
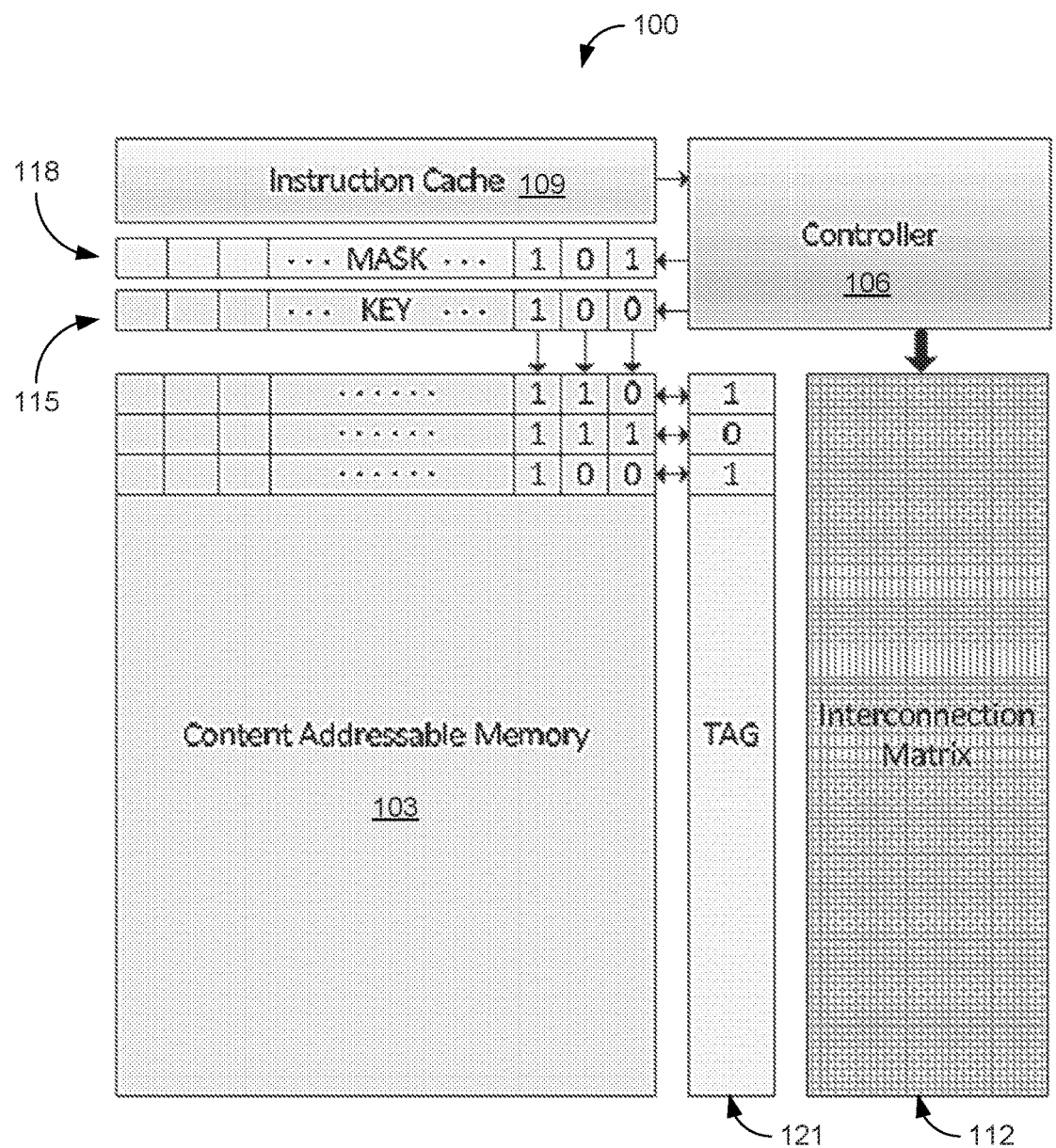
FIG. 1 is a graphical representation of an example of an associative processor (AP) in accordance with various embodiments of the present disclosure.

Disclosed herein are various examples related to resistive content addressable memory (RCAM) based in-memory computation architectures. Reference will now be made in detail to the description of the embodiments as illustrated in the drawings, wherein like reference numbers indicate like parts throughout the several views.

The use of nonvolatile, extremely high density, resistive memories to create parallel in-memory based computation platforms for mobile communication systems is investigated. The goal is to replace logic with memory structures, virtually eliminating the need for memory load/store operations during computation. Mobile systems are uniquely suited to this approach due to the vector based nature of their processing pipelines. By observing modern communications systems, one can make a number of general observations, as follows:

From a hardware perspective, the most notable change is the significant increase in storage utilized to support processing redundant data streams. Redundancy can be observed in space (Multiple Input Multiple Output systems, MIMO) or in time (Hybrid automatic repeat request, HARQ).

There has been a steady shift from sample based streaming processing to vector based processing driven by adoption of modulations such as Orthogonal Frequency Division Multiplexing (OFDM).

Since vector processing utilizes significant storage, memory has become dominant in today's systems, dictating chip power and area metrics.

Current vector processor solutions have not been adopted because they are significantly less efficient than ASICs in terms of power and area (or GOPS/W/mm2).

Associative processors (APs) are excellent computational platforms for massively parallel computing. Associative processors can be considered as a type of single instruction multiple data (SIMD) processor that combines the memory and processor in the same location. Since an operation can be performed on all memory words in parallel, the execution time of an operation does not depend on the vector size. This feature solves the memory-wall problem of traditional Von Neumann architectures since there is no inter-dependence between memory and processor. Numerous architectures of associative processors (APs) originated in the seventies and eighties; however, in the past, the adoption of APs was limited due to the unmanageable power and area requirements of such paradigms, such as Content Addressable Memory based Associative Processing (CAM-AP). This reality is changing with the availability of new semiconductor technologies and materials that allow for extremely dense memory structures (e.g., memristor, STT-MRAM, and ReRAM), leading to a resurrection of the AP approach.

A novel in-memory computation architecture, the resistive CAM (RCAM), is presented here. The implementation of basic arithmetic operations on this architecture and their performance, complexity, and area usage results are illustrated. The suitability of the RCAM architecture for mobile applications is demonstrated through the implementation of a proposed FFT operation, which is the core of OFDM transceivers. Results show that the RCAM architectures are at least an order of magnitude more energy-efficient per area, when compared to existing systems.

Referring to FIG. 1, shown is an example of the architecture of an associative processor (AP) 100. The AP 100 comprises content addressable memory (CAM) 103, controller 106, instruction cache 109, interconnection circuit 112, and specific registers. In the processor, instruction cache 109 holds the instructions that are performed on the CAM 103. The controller 106 generates the mask and key values needed for a corresponding instruction. Here, the key register 115 is used to contain the value that is written or compared against. The mask register 118 indicates which bit or bits are activated during comparison or write. The rows matched by the compare operation are marked in a tag field 121, that is, e.g., the rows tagged with logic "1" indicates that the corresponding CAM row has been matched with the given key and mask value, while logic "0" indicates that the row did not match. For example, if the key "100" is used and mask "101" is applied to the CAM 103, the tag bits 121 of the corresponding rows whose first and third bits are logic "0" and logic "1" respectively becomes logic "1" as shown in FIG. 1. The interconnection matrix 112 is a basic circuit switched matrix that allows rows of the AP 100 to communicate in parallel. This communication can be either bitwise or wordwise.

An operation of the AP 100 comprises consecutive compare and write phases. During the compare phase, the matched rows are selected and in the write phase, the corresponding masked key values are written onto tagged CAM words. Depending on the desired arithmetic operation, the controller 106 sets the mask and key values by referencing a look up table (LUT). In the compare phase, the key field 115 and mask field 118 are set and compared with CAM content, while in the write phase, tagged rows are changed with the key. In other words, the truth table of the function is applied (in an ordered sequence) to the CAM 103 to implement the needed function. Utilizing consecutive compare and write cycles with corresponding truth table, any function that can be performed on a sequential processor can be implemented in APs 100 as a parallelized operation. In the following sections, examples of the basic arithmetic operations performed on the AP 100 are detailed.

Addition and Subtraction. In traditional computer arithmetic, 2's complement is the most widely accepted representation in signed arithmetic operations. In the implementation of addition or subtraction, the result can be written into two locations; one of the input locations (e.g., A or B)

or a new location (e.g., R). The former one is referred to as in-place and later one is out-of-place.

The table of FIG. 2A shows an example of the look-up table (LUT) for both in-place and out-of-place additions. In all tables, R and Cr stand for result and carry, respectively. A and B indicate the inputs. Depending on the operation, the controller 106 sets the mask and key values by referencing the corresponding LUT. In the compare phase, the key and mask fields 115 and 118 are set and compared with the CAM content according to the left side of the table of FIG. 2A. In the write phase, the mask and key values are set similarly by observing the right side of the table of FIG. 2A. However, in this cycle, values in the tagged rows are changed with the key. To ensure correct operation, entries need to be appropriately ordered while applying the truth table, to avoid erasing a value that may be needed in later steps of the operation. The comment column in the table of FIG. 2A specifies the run order of this key combination where a NC (no change) indicates that the given input combination does not change any content in the CAM 103.

In out-of-place addition, the sum of the inputs A and B are written into R. Before the addition, all bits of R are assumed to be logic "0" to minimize cycles, by avoiding NC rows in the truth table. Due to the reuse of the B location in the in-place addition, it utilizes less cycles than the out-of-place addition. In both methods, the controller unit 106 of the AP 100 applies the truth table on each bit of the inputs (A and B) and carry (Cr) in order.

For subtraction, the table of FIG. 2B shows examples of the LUT for in-place and out-of-place subtraction (B=B−A) in the same manner as addition, but in this case, a borrow bit (Br) is used instead of the carry bit. Alternatively, subtraction can also be implemented by using addition in 2's complement representation; the complement of the subtrahend is added to minuend. However, this method comes with an additional area and time cost as detailed in the following section.

The algorithm in FIG. 3 shows the controller flow for linear operations. At the beginning of each cycle, mask and key values are set to point to the current values. For the in-place addition and subtraction, m steps are needed, where m is the number of bits per pass with a total of 4 passes per step. In the out-of-place addition or subtraction, m steps of five passes each are used.

Figure 4C:
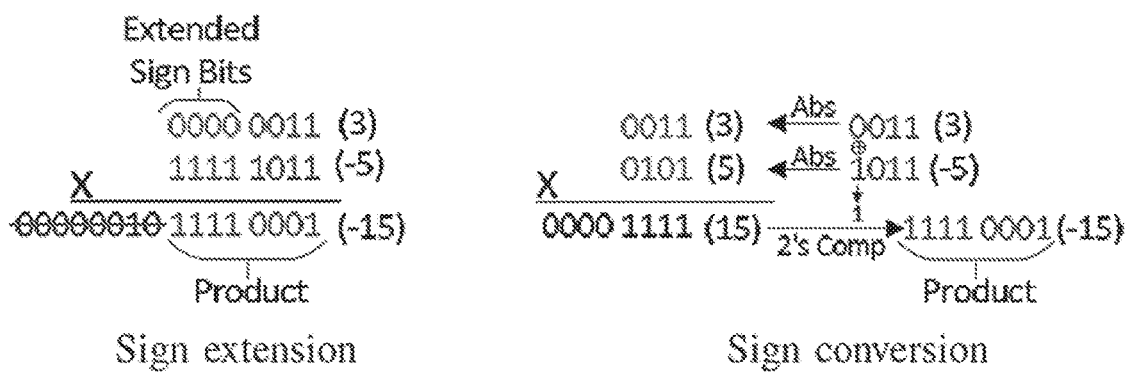

Absolute Value and Two's Complement. Absolute value and two's complement operations are very fundamental operations for FFT and many other algorithms. To find the 2's complement of a number, the table in FIG. 4A can be used. In the table of FIG. 4A, F stands for the flag and is stored in the CAM 103 (FIG. 1) as a temporary value similar to carry and borrow. The 2's complement operation needs to be out-of-place, thus the result is written to another place. During the operation, F becomes logic "1" at the first logic "1" bit of the input number (A) and after that, the truth table propagates through the A's bits. This operation takes m steps of 3 passes.

The LUT in the table of FIG. 4B shows an example of the truth table for absolute value operation. In the table of FIG. 4B, F and S stand for flag and sign bits, respectively. Here, S is used to represent the sign of the number (e.g., its last bit). If the sign is positive (logic "0"), this truth table has no effect and simply copies the content of input A to result R. This operation takes m steps where each step comprises 4 passes as shown in the table. On the other hand, if the sign is negative (logic "1"), the truth table performs the 2's complement operation. This absolute value truth table can also be used to revert a number to its original sign. For this operation, the sign of the number is stored in a location and during the absolute value operation; this sign can be given as the sign value instead of the real sign (last bit) of the number. This type of usage can be exploited in signed multiplication of FFT.

Multiplication and Division. In unsigned multiplication (R=A×B), the LUT shown in the table of FIG. 4C can be applied to CAM 103 (FIG. 1) for each combination of input bits. In other words, the LUT is applied to all bits of B for each bit of A. Indeed, the table of FIG. 4B performs the addition operation between B and R if the A's bit is logic "1." In the table of FIG. 4B, NP indicates the combinations that are not possible and they are also disregarded like NCs. By contrast to linear operations such as addition and absolute value, the multiplication operation is a quadratic operation. The algorithm of FIG. 3 shows the controller flow for unsigned multiplication. For each bit of A, the position of the carry is changed in accordance with the current partial addition. While the outer loop scans each bit of A, the inner loop scans bits of B and performs partial addition. For this reason, unsigned multiplication operation takes $m^2$ steps where each step comprises 4 passes. Additionally, multiply and accumulate operations (R=A×B+B) can be performed by the same LUT with the same cost. However, in this case, R needs to be initialized as B before the operation starts.

For signed multiplication, two ways can be used in APs 100. The first one is a sign extension method. In this method, sign bits of the inputs are extended to the number of bits in the result and then these numbers are multiplied. After, the most significant digits of the multiplication are discarded; the remaining ones become the product. FIG. 5A exemplifies the sign extension method in multiplication. In the second method exemplified in FIG. 5B, absolute values of two inputs are first computed. This operation can be performed as out-of-place by using the table of FIG. 4B. After that, the absolute values can be multiplied by the unsigned multiplication function. This result is the absolute value of the real product. At the end, the absolute value of the result can be converted to its original value by using the same absolute value function. During the conversion, the sign bit is taken as the XOR of the sign bits of inputs A and B. If the result is positive, the converted number remains the same, otherwise it is complemented.

The most commonly used operations in many applications are multiplication, addition, and subtraction. For this reason, the detailed description of the division algorithm, which can be easily derived from successive subtraction and mask shift, is deferred. The expected complexity of such operation is $O(m^2)$.

Evaluation of Arithmetic Operations. Referring to the table of FIG. 6, shown are examples of the run time, area usage, and algorithmic complexities of each operation. In the addition and subtraction, the number of passes are four and five for in-place and out-of-place additions, respectively. Run time and area complexity are always better for in-place addition, however, in some cases, B is preserved (e.g. in FFT), so out-of-place addition is utilized. For signed multiplication, the sign conversion method always outperforms the sign extension method in run time if m is greater than 1.

Referring to FIGS. 7A and 7B, shown are comparisons of AP 100 (FIG. 1) and other architectures for multiplication and addition operations, respectively. The plots of FIGS. 7A and 7B show the performance results of multiplication and addition operations separately in an AP, single processor, and vector processor. As shown in FIGS. 7A and 7B, the AP 100 outperforms the single processor after a threshold value of vector size. Moreover, data moving costs (e.g. data access, cache misses) imposes additional overhead to single and vector processors and they are not taken into account. On the other hand, all data in the AP 100 are processed in-place so that there is no need for data moving operations.

While the operation of APs 100 to implement arithmetic building blocks for computing systems have been discussed, devices and circuits that can be used to implement a CAM 103 (a unit of APs 100) based on memristors will now be described.

Resistive CAM (RCAM) arrays can be built using gated or gateless memory cells. Referring to FIGS. 8A and 8B, shown are (a) perspective views and (b) schematic diagrams of examples of a gateless memristor cell and a gated memristor cell, respectively. Gateless cells provide the highest density, where each memory cell is a single memristor fabricated as a thin film located at the intersection of each two bars, as shown in FIG. 8A. The commonly used active materials are the oxides of titanium, hafnium, or tantalum. A major drawback of this architecture is the abundant availability of paths for sneak currents, which flow through the memory cells parallel to the desired one and significantly impact the readout operation. The impact of the sneak-paths on the accuracy of the readout operation and its power consumption has been studied and a closed-form solution for the memristor-based memory sneak-paths has been introduced. The presented technique fully eliminates the effect of sneak-paths, by reading the stored data using multiple access points and evaluating a simple addition/subtraction on the different readings. The new method uses fewer reading steps compared to previously reported techniques, and has a very small impact on the memory density.

FIG. 8B shows an example of a transistor-gated array, which mimics the classical DRAM architecture. The introduced gate devices cut the undesired sneak-paths, at the expense of the array density, which is then dominated by the transistor footprint. If smaller transistors are used to maintain the high density, the array can suffer from leakage current, which prevents the memory from working correctly. A readout technique and its underlying circuitry, which is able to compensate the effect of leakage current in high-density gated memristor arrays, can be used to address this problem. Chips with such structures combining CMOS FETs and memristors can be used.

Memory can be used for data storage and processing, which set the main guidelines for circuit design. While being able to search the memory in a parallel fashion may be a primary concern for CAMs 103 (FIG. 1), the case is different for associative computing. As highlighted by the previous examples, other properties are used to enable CAM-AP data processing. These properties include masked search and parallel column write. Various CAM cells can be used to achieve this, as presented in the table of various CAM cell candidates in FIG. 9A. One of the most promising candidates for a CAM basic cell is shown in the right column comprising two transistors and two memristors ("2T2M"). This is a REDOX compatible cell complies with the associative computing needs.

Referring to FIG. 9B, shown are schematic diagrams illustrating different states of a "2T2M" cell of a CAM array. The basic operation of a CAM array is to identify the location of matches against a search word. This is typically achieved by pre-charging all the rows of the array, and then a search word is applied to the columns. During the evaluation phase shown in diagram (a) of FIG. 9B, only rows carrying matching data will retain charge. Therefore, a CAM cell should connect a path to the ground in case of a mismatch between the data it is holding and the data assigned to its column.

Binary data is stored in the memristor device is the form of "high" and "low" resistances. Therefore, the device can work as a storage element and a switch at the same time, as in the "2T2M" cell. The charges on a row capacitance leaks the mismatched cell, where the memristor and the series transistor are of low resistance creating a path to the ground, as shown in diagram (b) of FIG. 9B. The data is stored in the "2T2M" cell that is in a complimentary mode, since the high resistance device will not leak charges to the ground even in case of mismatch, however its complement device will do so. Diagram (c) of FIG. 9B shows the state of the CAM cell in case of a match, where no path to ground is available. A "dont care" state can be stored on the cell by setting its two memristors to "high" resistance diagram (d) of FIG. 9B, where no path is created to the ground independent of the search bit.

Writing to CAM 103 in an AP system 100 (FIG. 1) is performed using a one column at a time scheme. However, this is translated into two writing steps, since a complimentary data column is electively made of two columns of the CAM array. The bits to write are loaded to the match lines of the rows, with a search word of logic "0" or logic "1" at the column of interest and "dont care" states elsewhere is written to the columns to activate the column of interest. This eliminates the need for any modification to the column driving circuitry used for reading.

A reconfigurable associative processor (RAP) system architecture achieves reconfigurability via a combination of RCAMs and crossbar arrays as building blocks. The architecture comprises interleaved sets of RCAMs and crossbar arrays. By programming the crossbar arrays, it is possible to realize different connection schemes between the RCAMs. A control processor programs the RCAMs and crossbar switches, and provides the sequencing of the operations performed on the RCAMs, as well as managing the data I/O. Given an application, or a complete system, the best possible way of connecting the RCAMs and the optimal sequencing of operations can be determined based on the overall system requirements. Therefore, different system architectures can be envisioned on the RAP architecture. Some of these implementations are illustrated in FIG. 10. If area and resources are a constraint, then a feedback pipeline implementation (a) of FIG. 10 makes sense as it uses only one stage implementation with feedback. If a task with high recurrence and a fixed number of data (e.g., FFT) is considered, then a hardwired pipeline implementation (b) of FIG. 10 is most appropriate, where each stage in the hardwired pipeline performs a butterfly and the data is transposed by wiring to the next stage. If flexibility and performance are important, then reconfigurable pipeline implementation (c) of FIG. 10 would be best as it allows for the effective change of interconnection patterns and dynamic reconfiguration of the pipeline as needed.

Fast Fourier transform (FFT) comprises butterfly operations in successive stages. Each stage includes a number of butterfly operations depending on the input size. The butterfly operation is the fundamental building block of the FFT. FIG. 11A shows the simplest butterfly diagram comprising two inputs, two outputs and one exponential coefficient. FIG. 11B shows an example of a radix-2, 4-point FFT operation in two stages. As shown in FIG. 11B, after each stage, the partial outputs of previous stages are re-arranged as an input of the next butterfly stages. From AP-based point of view, each row can be regarded as a different processor with their own registers. In order to perform a butterfly operation, two input and one exponential factor needs to be stored in the same row. However, after completion of a butterfly stage, the output of the previous stage is rearranged for the next stage.

Figures 11C, 11D:
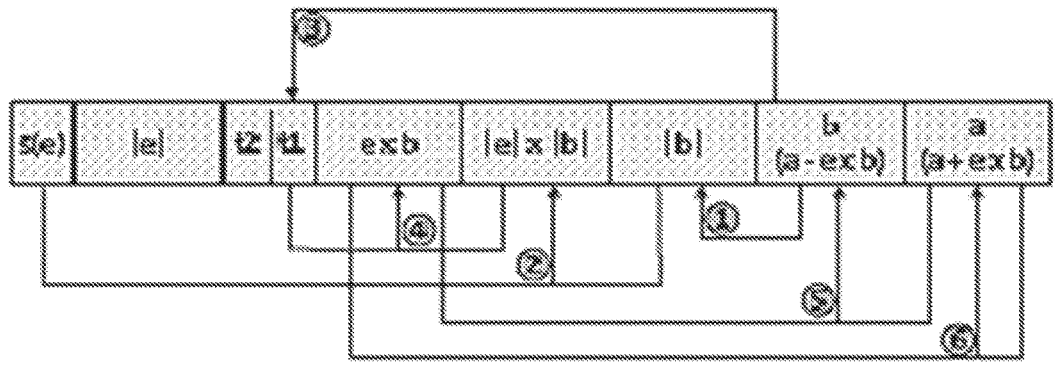

In the RAP, all butterfly operations on a CAM 103 (FIG. 1) are performed simultaneously, so the running time of one stage does not depend on the number of samples. FIG. 11C illustrates the step-by-step butterfly operation on a CAM row. The correspondence of each step is explained in the algorithm shown in FIG. 11D. In the algorithm of FIG. 11D, each operation is performed on complex numbers, that is, performed on real and imaginary parts separately.

Figure 12:
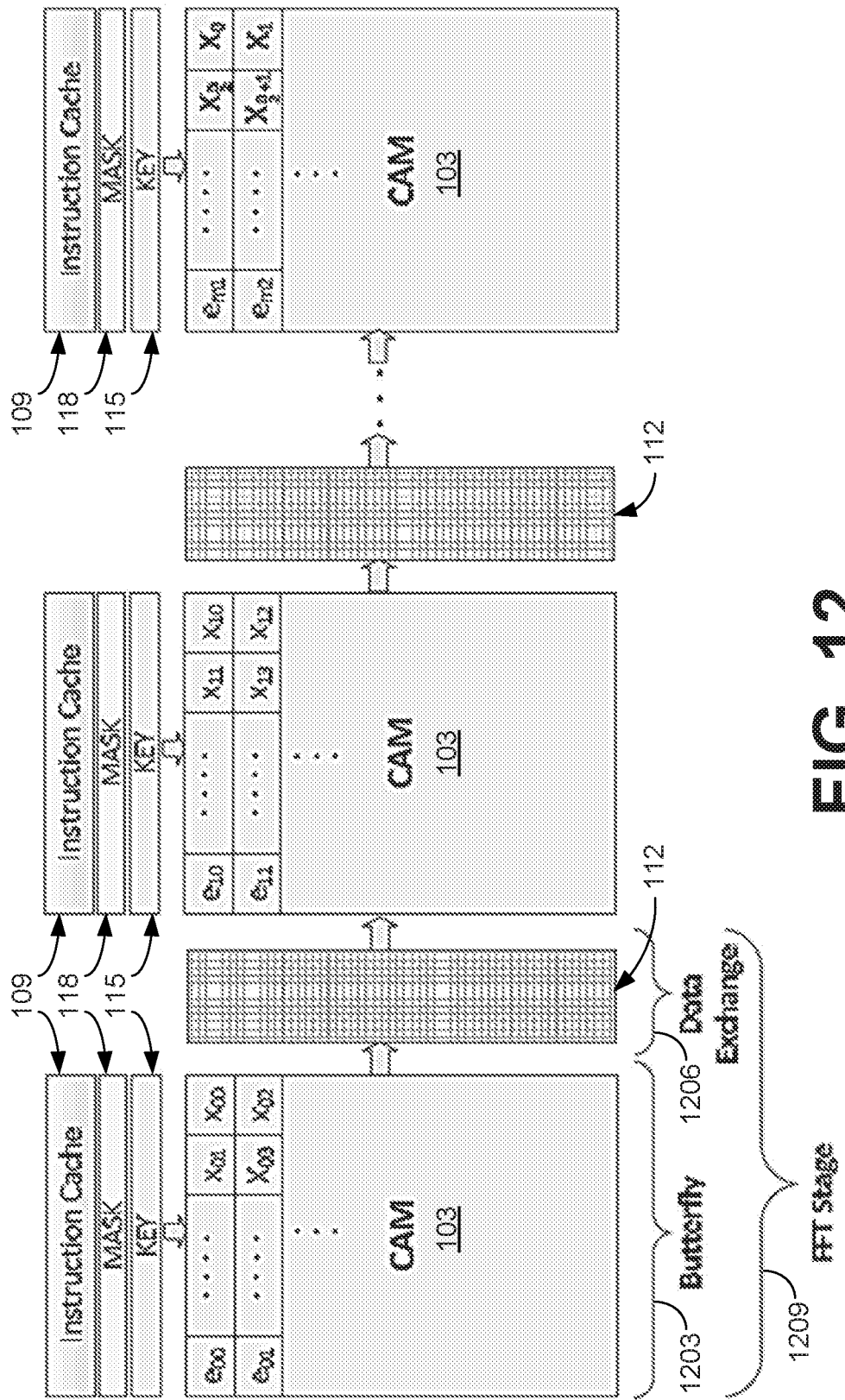
FIG. 12 is a graphical representation of an example of a reconfigurable associative processor (RAP) system in accordance with various embodiments of the present disclosure.

For the FFT implementation on RAP, the architecture illustrated in FIG. 12 can be used. The architecture comprises the pipelined RAPs. In RAPs, the FFT operation comprises consecutive butterfly and data exchange phases. The combination of one butterfly phase 1203 and its data exchange phase 1206 corresponds to one FFT stage 1209. Each stage of the pipelined RAPs corresponds to a stage in the FFT. Each row of the RAP is responsible of performing a butterfly operation, so it stores two input data in the same row to perform the butterfly operation. After each stage, the partial outputs are directed to the corresponding places in the following CAM 103 by the interconnection matrix 112. The interconnection matrix 112 can be implemented as a hard-wired or programmable matrix. In the figure, $e_{sr}$ stands for the twiddle factor of corresponding stage s and row r, whereas $x_{si}$ corresponds the input of a butterfly operation where s is the stage number and i is the input number. For example, $x_{00}$ corresponds to the first input of the first butterfly stage. For a n-point FFT operation, the overall system needs $\log_2(n)$ RAPs and each RAP uses n/2 rows. For example, the system utilizes 10 RAPs and 512-rows in each RAP for 1024-point FFT operation. The exponential coefficients ($e_{xy}$) are assumed to be placed to the CAM arrays before the operations. It is worth noting that order of $x_{0i}$ values is reverse bit order of the real input samples ($x_0$, $x_1$, . . . , $x_n$).

Figure 13:
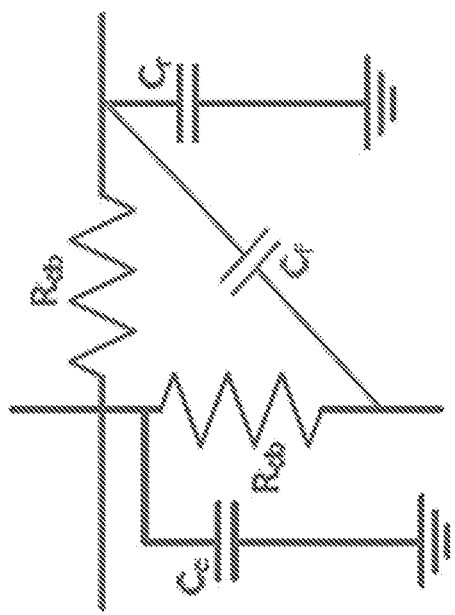
FIG. 13 is a schematic diagram of an example of a crossbar equivalent circuit in accordance with various embodiments of the present disclosure.

An in-house simulator was developed and utilized to efficiently simulate realistic CAM memories. The simulator is capable of performing transient and DC simulations on array sizes of up to 10M pixels allowing for accurate simulations. The simulator is driven by a Python script that creates netlists based on CAM parameters, needed sweep parameters and data patterns utilizing HSPICE or Cadence APS iteratively. The test memory can be prepopulated with any needed data pattern, including worst-case data (all zeros and all ones), random data, and NIST standard RAM images. For the transistors, Predictive Technology Models (PTM) were used to simulate high-density memories with sub 20 nm feature sizes. For the memory element, the platform allows plugging any model for any two terminal resistive devices. FIG. 13 shows the crossbar equivalent circuit per unit cell, where $R_{cb}$ is the line resistance per unit cell, $C_r$ and $C_c$ are the lines to ground stray capacitance, and $C_f$ is the fringing capacitance between the crossbar lines per unit cell. The simulator models the crossbar in an accurate manner, by including many non-idealities to the model such as the crossbar lines impedance, etc.

Circuit simulation results are a component for the system level simulation of the associative processing pipeline. There are basically two operations to be evaluated: search and write. For search, there are two types of operations: a full search, where the whole array is searched as in typical CAM operation, and a masked search, where only the columns of interest are searched, which is commonly used for performing associative processing over CAM. For write, one column is written at a time. Note that because there are two "1T1R" (one transistor and one resistor) structures per cell, two cycles are needed per column. Only matched cells are written following each search and match. While circuit simulation for both were carried out, only the masked search results will be used for the AP system analysis and design. The circuit was designed to pre-charge and evaluate in a total time of 3.3 ns.

Figure 14:
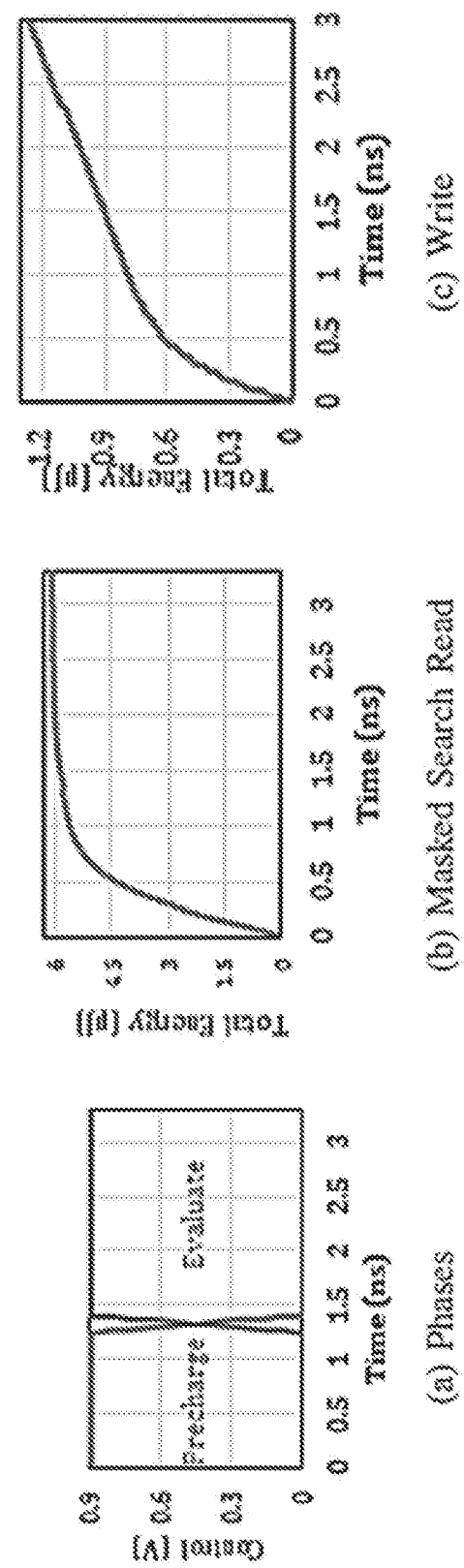

Referring to FIG. 14, examples of (a) pre-charge and evaluate phase control signals, (b) energy for search, and (c) energy for write are shown. In plot (a) of FIG. 14, the transitions between the control signals "θ" and "$\bar{\theta}$" are shown. The total energy over time for masked search read is illustrated in plot (b) and for write is illustrated in plot (c) of FIG. 14. For the simulation presented here, an array length of 1024 and an array width of 66 (33 effective bits to represent two 16-bit variables and a carry bit), which was populated with random data, was used. The crossbar model values were selected based on the ITRS (International Technology Roadmap for Semiconductors) numbers and the crossbar resistance analysis presented in "Memristor multi-port readout: A closed-form solution for sneak paths" by M. Zidan et al. (Nanotechnology, *IEEE Transactions on*, vol. 13, no. 2, pp. 274-282, March 2014), where $R_{cb}$=4, $C_c$=$C_r$=10 pF, and $C_f$=100 pF. For the memristor model, the memory device model presented in "Writing to and reading from a nano-scale crossbar memory based on memristors" by P. O. Vontobel et al. (*Nanotechnology*, vol. 20, no. 42, p. 425204, 2009) was adopted, and for the transistors, we used the 16 nm LSTP transistor model presented in "Predictive technology model (ptm)" (Arizona State University, http://ptm.asu.edu/). All the presented circuit simulations were performed using Cadence APS. The worst case condition was assumed in the simulations, where no caps were initially charged. However, some of these capacitors may be partially charged from a previous search operation, which could save considerable energy.

The 1024×33 RCAM search simulation results are illustrated in FIG. 15. Plots (a) and (b) show the match lines over time for the full search match and the masked search match, respectively, and plots (c) and (d) show the source current over time for the full search current and the masked search current, respectively, over the pre-charge and evaluate phases. The average current is shown by the dashed line. For the simulation parameters indicated, a cycle time of 3.3 ns is possible. The table of FIG. 16 summarizes the power and energy consumption of the simulated CAM array. A common figure of merit used in evaluating energy efficiency of the CAMs is the energy/bit/search. The RCAM achieved 0.2 fJ/bit/search. This compares quite favorably with state-of-the-art CMOS based CAMs, which range from about 2 to 0.16 fJ/bit/search. Due to the aggressive speed design, the write energy of 1.27 pJ was slightly higher than the values reported by ITRS. On the other hand, the 3.3 ns RCAM delay was not too competitive as CMOS CAMs can have delays in the 1 to sub ns range, however the significant advantage of memristor CAMs is its compact cell design as will be discussed. The true potential of this technology comes from its superior area efficiency, which results in vastly improved GOPS/W/mm² figure of merit as will be shown later.

The proposed system comprises two main blocks, the AP array and the connecting matrix. The AP array includes a MOS gated memristor crossbar, while the switching matrix is a simple gateless memristor array. The resistive MOS-gated array density was 71 Gbit/cm² with 16 nm transistors.

The denser gateless array can reach a density of 1 Tbit/cm$^2$ (International Technology Roadmap for Semiconductors). For the area estimation, consider a single pipeline stage with 66 cells of width and 1024 words of length. This is equivalent to two 16-bit width vectors and a carry column, where each bit is made of two memory cells. This translated into an array of size of 66k cells. A square gateless switching matrix of 1M cells was needed to connect the pipeline stage with the next one, or to feedback on itself depending on the system architecture. To operate at a 303 MHz frequency, the driving circuitry will add around 40% area overhead, when using 16 nm LSTP devices. Using these numbers; in total, the area of the 1024×66 array was estimated at 2.5×10−4 mm$^2$ utilizing 16 nm transistors. It should be noted that this number could be simply scaled to any pipeline stage size.

Figure 17A:
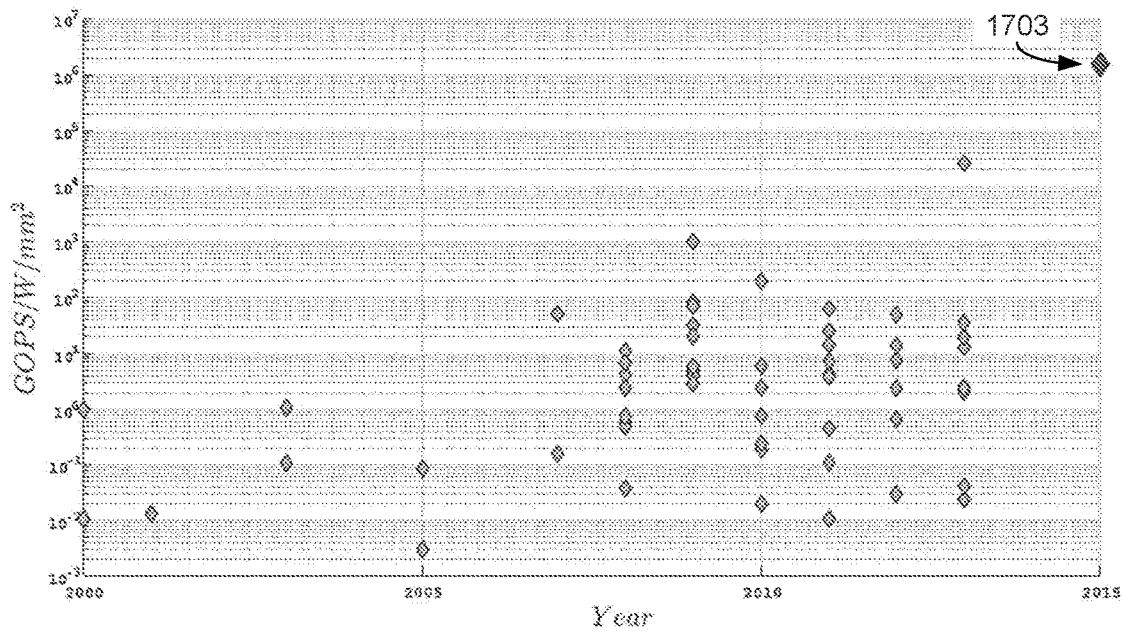
FIGS. 17A and 17B includes a comparison of Figures of Merit (FOMs) for different architectures in accordance with various embodiments of the present disclosure.
Figure 17B:
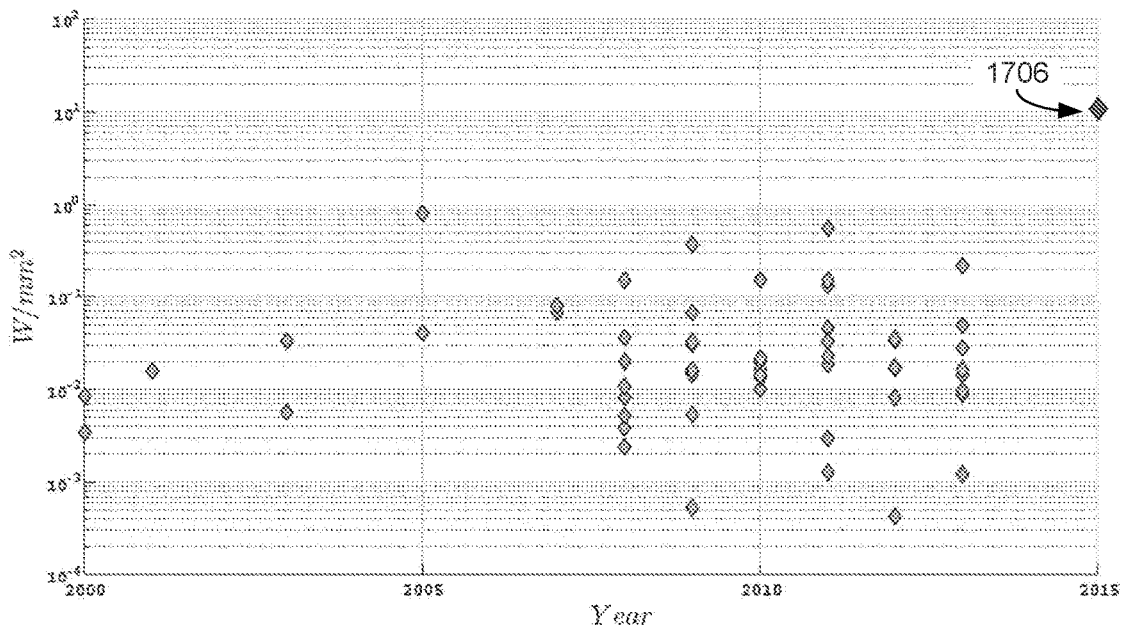

FIGS. 17A and 17B show the GOPS/W/mm$^2$ and W/mm$^2$ Figures of Merit (FOMs), respectively, extracted from different chip realizations of parallel processing systems. The FOM for the ROAM is shown as points 1703 and 1706. This is contrasted with comparative data from "Parallel processing architectures and power efficiency in smart camera chips" by . T. Ricardo Carmona-Galan et al. (Workshop on the Architecture of Smart Cameras, 2014). The high density of the RCAM architecture coupled with the simple design and elimination of data movements, results in GOPS/W/mm$^2$ that is 1-2 orders of magnitude higher than existing approaches. While high GOPS/W/mm$^2$ is desirable, the power density (W/mm$^2$) is about 4-10 times higher than existing architectures. This may be indeed the limiting factor in scaling the ROAM architecture.

In this study, the fast fourier transform on associative processors was introduced based on memristive technology. For the system realization, the implementation of fundamental arithmetic operations on associative processors were presented and then a realization of an associative processor using memristor technology was discussed. As seen from the results, memristor technology provides a promising solution for vector based systems such as mobile computing.

This disclosure presented the potential of using high density emerging resistive memories as a means of enabling in-memory computation, virtually eliminating the need for memory load/store operations during computation. To date, this has been an elusive goal due to the unmanageable power and area requirements of such paradigms, such as content addressable memory based associative processing (CAM-AP). However, the advances in resistive memories creates a paradigm shift in this field. Leveraging the memory intensive vector based nature of modern communication systems, a memory based computation system has been presented where logic can be replaced by memory structures. The massive parallelism enabled by such a paradigm results in highly scalable structures, capable of performing in-place computations. Test results show that the ROAM architectures are an order of magnitude more energy-efficient, and at least an order of magnitude more area efficient compared to existing systems. This can enable the creation of mobile processing architectures that achieve low cost, energy efficient realizations of state-of-the-art wireless systems.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An associative processor system, comprising:
 a content addressable memory (CAM) including an array of cells, where individual cells of the array of cells comprise a memristor based crossbar;
 an instruction cache configured to hold instructions to be performed by the CAM;
 a controller;
 a key register controlled by the controller, the controller being configured to generate key values and store the key values in the key register;
 a mask register controlled by the controller, the controller being configured to generate mask values and store the mask values in the mask register;
 the CAM configured to mark tag bits in a tag field for rows of the CAM that are compared and matched based on the key and mask values; and
 an interconnection switch matrix circuit coupled to an output of the CAM, the interconnection switch matrix circuit comprising a gateless memristor array,
 wherein the interconnection switch matrix circuit is configured to allow rows of the CAM to communicate in parallel.

2. The system of claim 1, wherein the mask register indicates which bit or bits of the key value is activated for comparison or writing with a corresponding bit or bits of a data value stored in a row of the CAM.

3. The system of claim 2, wherein the tag bits are each associated with one row of the CAM, the tag bits indicating whether the bit or bits of the key value that are activated by the controller matches the corresponding bit or bits of the data value stored in that one row of the CAM.

4. The system of claim 1, wherein the controller is configured to generate the key value and the mask value for the mask register in response to a next instruction to be performed on the data value in the CAM.

5. The system of claim 1, wherein the key value and the mask value are based upon values selected by the controller from a look up table.

6. The system of claim 1, wherein the instructions are performed by the controller on one or more data value in the CAM.

7. The system of claim 1, wherein communications among the rows of the CAM are bitwise or wordwise.

8. The system of claim 7, wherein the interconnection switch matrix is reconfigurable.

9. The system of claim 1, wherein the interconnection switch matrix circuit is configured to direct communications to rows of a second CAM.

10. The system of claim 1, comprising a second CAM coupled to an output of the interconnection switch matrix and a second interconnection switch matrix coupled to the second CAM.

11. The system of claim 1, comprising a series of CAMs configured to implement successive stages of a Fast Fourier transform (FFT), where data exchange between the series of CAMs is provided by interconnection switch matrices.

12. The system of claim 1, wherein the interconnection switch matrix circuit is configured to direct the communications to different rows of the CAM.

13. The system of claim 1, wherein the memristor based crossbar is a gated memristor crossbar.

14. An associative processor system, comprising:
- a first content addressable memory (CAM) including a first array of cells, where individual cells of the first array of cells comprise a first memristor based crossbar;
- an instruction cache configured to hold instructions to be performed by the first CAM;
- a controller;
- a key register controlled by the controller, the controller being configured to generate key values and store the key values in the key register;
- a mask register controlled by the controller, the controller being configured to generate mask values and store the mask values in the mask register;
- the CAM configured to mark tag bits in a tag field for rows of the first CAM that are compared and matched based on the key and mask values;
- a second CAM including a second array of cells, where individual cells of the second array of cells comprise a second memristor based crossbar; and
- an interconnection switch matrix circuit coupled to an output of the first CAM and an input of the second CAM to provide data output from the first CAM to the second CAM, the interconnection switch matrix circuit comprising a gateless memristor array, wherein the interconnection switch matrix circuit is configured to allow rows of the first CAM to communicate in parallel.

15. The system of claim 1, wherein the memristor based crossbar comprises a plurality of transistors and memristors.

16. A method for an associative processor system comprising a content addressable memory (CAM) including an array of cells that includes a key register storing a key value, where individual cells of the array of cells comprise a memristor based crossbar and an interconnection switch matrix circuit coupled to an output of the CAM, the interconnection switch matrix circuit comprising a gateless memristor array, the method comprising:
- comparing with a controller activated bit values stored by the controller in the key register with corresponding bit values stored by the controller in a row of the CAM, wherein the comparison is based on a mask value, which is stored by the controller in a mask register, indicating which bit values of the key value are the activated bit values;
- setting, responsive to the comparison, a tag bit value in a tag field to indicate that the activated bit values match the corresponding bit values in the row of the CAM; and
- writing with the controller, responsive to the tag bit value, masked key bit values to corresponding bit locations in the row of the CAM,
wherein the interconnection switch matrix circuit is configured to allow rows of the first CAM to communicate in parallel.

17. The method of claim 16, wherein the comparing, setting, and writing performs an arithmetic operation using the CAM.

18. The method of claim 17, further comprising:
- setting the key value and the mask value using a look up table (LUT) depending on which particular arithmetic operation is being performed.

19. The method of claim 16, wherein all data in the CAM is processed in-place without requiring data moving operations.

* * * * *